(12) United States Patent
Stachler et al.

(10) Patent No.: US 8,977,399 B2
(45) Date of Patent: Mar. 10, 2015

(54) STAGGERED START-UP HVAC SYSTEM, A METHOD FOR STARTING AN HVAC UNIT AND AN HVAC CONTROLLER CONFIGURED FOR THE SAME

(75) Inventors: John P. Stachler, Plano, TX (US); Stephen A. Walter, Flower Mound, TX (US); Alan E. Bennett, Denton, TX (US); Richard A. Mauk, Lewisville, TX (US)

(73) Assignee: Lennox Industries Inc., Richardson, TX (US)

( * ) Notice: Subject to any disclaimer, the term of this patent is extended or adjusted under 35 U.S.C. 154(b) by 1231 days.

(21) Appl. No.: 12/694,503

(22) Filed: Jan. 27, 2010

(65) Prior Publication Data

US 2010/0298988 A1    Nov. 25, 2010

Related U.S. Application Data

(60) Provisional application No. 61/180,405, filed on May 21, 2009.

(51) Int. Cl.
| | |
|---|---|
| *G06F 19/00* | (2011.01) |
| *G01M 1/38* | (2006.01) |
| *G05B 13/00* | (2006.01) |
| *G05B 15/00* | (2006.01) |
| *G05D 23/00* | (2006.01) |
| *F28F 27/00* | (2006.01) |
| *F24F 11/04* | (2006.01) |
| *F24F 11/06* | (2006.01) |
| *F24F 11/00* | (2006.01) |
| *H01R 13/645* | (2006.01) |
| *H01R 12/50* | (2011.01) |

(52) U.S. Cl.
CPC ........ *H01R 13/6456* (2013.01); *H01R 23/7073* (2013.01)
USPC ........... 700/276; 700/210; 700/277; 700/300; 165/200; 165/244; 165/247; 165/267; 236/1 B; 236/1 C; 236/44

(58) Field of Classification Search
USPC .......... 700/210, 276–277, 300; 165/200, 244, 165/247, 267; 236/1 B, 1 C, 44
See application file for complete search history.

(56) References Cited

U.S. PATENT DOCUMENTS

| | | | | |
|---|---|---|---|---|
| 3,742,303 | A * | 6/1973 | Dageford | 361/22 |
| 4,470,266 | A * | 9/1984 | Briccetti et al. | 62/126 |
| 4,502,842 | A * | 3/1985 | Currier et al. | 417/8 |
| 4,614,089 | A * | 9/1986 | Dorsey | 62/158 |
| 4,749,881 | A * | 6/1988 | Uhrich | 307/41 |
| 4,990,057 | A * | 2/1991 | Rollins | 417/12 |

(Continued)

OTHER PUBLICATIONS

Japan Document No. JP 05118617 A, "Controller of Air Conditioner" Yoichi Sugawara, 6 pages (including 2 pages taken from EAST showing pertinent areas within the document that were relied upon in the office action).*

*Primary Examiner* — Ronald Hartman, Jr.

(57) ABSTRACT

An HVAC controller, a method of starting a HVAC unit and a HVAC system are disclosed herein. In one embodiment, the HVAC controller includes: (1) an interface configured to receive a delay originating signal and (2) a processor configured to automatically generate an offset delay value for the HVAC unit upon receipt of the delay originating signal and delay starting identified components of the HVAC unit based on the offset delay value.

18 Claims, 3 Drawing Sheets

(56) References Cited

U.S. PATENT DOCUMENTS

| | | | |
|---|---|---|---|
| 5,216,897 A * | 6/1993 | Tsuchiyama | 62/158 |
| 5,465,588 A * | 11/1995 | McCahill et al. | 62/127 |
| 5,623,836 A * | 4/1997 | Mrozinsky et al. | 62/151 |
| 5,765,636 A * | 6/1998 | Meyer et al. | 165/247 |
| 6,216,479 B1 * | 4/2001 | Elwood | 62/230 |
| 6,349,883 B1 * | 2/2002 | Simmons et al. | 236/46 R |
| 6,434,957 B1 * | 8/2002 | Nishizuka et al. | 62/175 |
| 6,807,815 B2 * | 10/2004 | Lee et al. | 62/158 |
| 7,222,494 B2 * | 5/2007 | Peterson et al. | 62/178 |
| 7,231,773 B2 * | 6/2007 | Crane et al. | 62/175 |
| 7,404,299 B2 * | 7/2008 | Drysdale et al. | 62/228.1 |
| 7,461,514 B2 * | 12/2008 | Roehm et al. | 62/133 |
| 7,575,179 B2 * | 8/2009 | Morrow et al. | 236/91 D |
| 7,757,961 B2 * | 7/2010 | Matsui | 236/44 C |
| 7,809,472 B1 * | 10/2010 | Silva et al. | 700/277 |
| 7,821,218 B2 * | 10/2010 | Butler et al. | 318/461 |
| 2006/0162352 A1 * | 7/2006 | Roehm et al. | 62/133 |
| 2007/0144193 A1 * | 6/2007 | Crane et al. | 62/228.4 |
| 2007/0246553 A1 * | 10/2007 | Morrow et al. | 236/46 R |
| 2007/0257121 A1 * | 11/2007 | Chapman et al. | 236/44 |
| 2011/0085917 A1 * | 4/2011 | Ward | 417/36 |
| 2013/0291576 A1 * | 11/2013 | Wada et al. | 62/129 |

* cited by examiner

STAGGERED START-UP HVAC SYSTEM, A METHOD FOR STARTING AN HVAC UNIT AND AN HVAC CONTROLLER CONFIGURED FOR THE SAME

CROSS-REFERENCE TO RELATED APPLICATION

This application claims the benefit of U.S. Provisional Application Ser. No. 61/180,405, filed by Mark Beste, et al., on May 21, 2009, entitled "Comprehensive HVAC Control System," and incorporated herein by reference in its entirety.

TECHNICAL FIELD

This application is directed, in general, to heating, ventilating and air conditioning (HVAC) systems and, more specifically, to preventing power spikes associated with the HVAC systems.

BACKGROUND

HVAC systems can be used to regulate the environment within an enclosed space. Typically, an air blower is used to pull air from the enclosed space into the HVAC system through ducts and push the air back into the enclosed space through additional ducts after conditioning the air (e.g., heating, cooling or dehumidifying the air). Various types of HVAC systems, such as rooftop units, may be used to provide conditioned air for enclosed spaces.

When two or more rooftop units (RTU), each comprising elements for heating, cooling, blower (HCB), and control, come into a condition requiring one or more HCB elements to come on from an off state, it is desired that the operation of these elements does not create an unusually high power requirement. An unwanted "power spike" may occur due to blower motors, compressors and/or heating elements starting at the same time after a power cycle. Additionally, the power spike may occur in response to a building going into an occupied state which can cause a cooling or heating demand for multiple units. To prevent power spikes, some HVAC units may be manually programmed with a default start-up value. However, this is can be time consuming and require coordination with other HVAC units at a particular location.

SUMMARY

In one aspect, an HVAC controller is disclosed. In one embodiment, the HVAC controller includes: (1) an interface configured to receive a delay originating signal and (2) a processor configured to automatically generate an offset delay value for the HVAC unit upon receipt of the delay originating signal and delay starting identified components of the HVAC unit based on the offset delay value.

In another aspect, a method for starting a HVAC unit is disclosed. In one embodiment, the method includes: (1) receiving a delay originating signal at a controller for the HVAC unit, (2) automatically generating the offset delay value for the HVAC unit based upon receipt of the delay originating signal and (3) starting identified components of the HVAC unit based on the offset delay value.

In yet another aspect, a HVAC system is provided. In one embodiment, the HVAC system includes: (1) a first and second HVAC unit, each HVAC unit including: (1A) a refrigeration circuit having at least one compressor, a corresponding evaporator coil and a corresponding condenser coil, (1B) an indoor air blower configured to move air across the evaporator coil, (1C) an outdoor fan configured to move air across the condenser coil and (1D) a controller coupled to the refrigeration circuit, the indoor air blower and the outdoor fan. Each controller having: an interface configured to receive a delay originating signal and a processor configured to automatically generate an offset delay value for the HVAC unit upon receipt of the delay originating signal and delay starting identified components of the HVAC unit based on the offset delay value, wherein an offset delay value for the first HVAC unit differs from an offset delay value for the second HVAC unit.

BRIEF DESCRIPTION

Reference is now made to the following descriptions taken in conjunction with the accompanying drawings, in which.

DETAILED DESCRIPTION

Start-up of HVAC units may be delayed for some random time so that the HCB elements from multiple HVAC units do not come on simultaneously and thereby possibly generating power-spikes. This disclosure provides embodiments for staggering the start-ups of HVAC units without requiring set-up steps. Embodiments are provided where the start-up time delay is not bypassed when a set point or occupancy command is received via a network connection. Instead, a unique command may be required in order to bypass the start-up time delay. Additionally, the start-up time delay may be enforced even when a thermostat input is used.

Different embodiments are disclosed wherein two or more HVAC controllers delay HCB operation of corresponding HVAC units for a random period of time to ensure HCB elements do not simultaneously come on following the delay. As such, the different HVAC units for a particular application can have a staggered start-up (i.e., the collection of HVAC units are said to be staggered). An application is an installation of HVAC equipment at a site for a customer. For example, the application may be for a particular school, restaurant, grocery store, factory, etc. For staggered start-up, a particular application would include multiple HVAC units. Thus, when a new demand, such as a heating or cooling demand, requires a HVAC controller to turn on identified components, the various disclosed embodiments can be used to minimize or eliminate power spikes due to multiple HVAC units turning on identified components at the same time. The identified components may be high current components including air blower motors, compressors, electrical heating elements and other HVAC components that require high power capacity at start-up (e.g., high locked rotor amps).

A controller for a HVAC unit is configured to direct the operation of a HVAC unit. Typically, each HVAC unit will include a designated controller. An HVAC controller may be one or more electric circuit boards including at least one micro-processor or micro-controller integrated circuit. The HVAC controller also includes the support circuitry for power, signal conditioning, and associated peripheral devices. In addition to a processor, the HVAC controller may include a memory having a program or series of operating instruction (i.e., firmware or software) that executes in such a way as to implement the features described herein when initiated by the processor. Additionally, the processor is configured to provide control functionality beyond the scope of the present disclosure.

Figure 1:
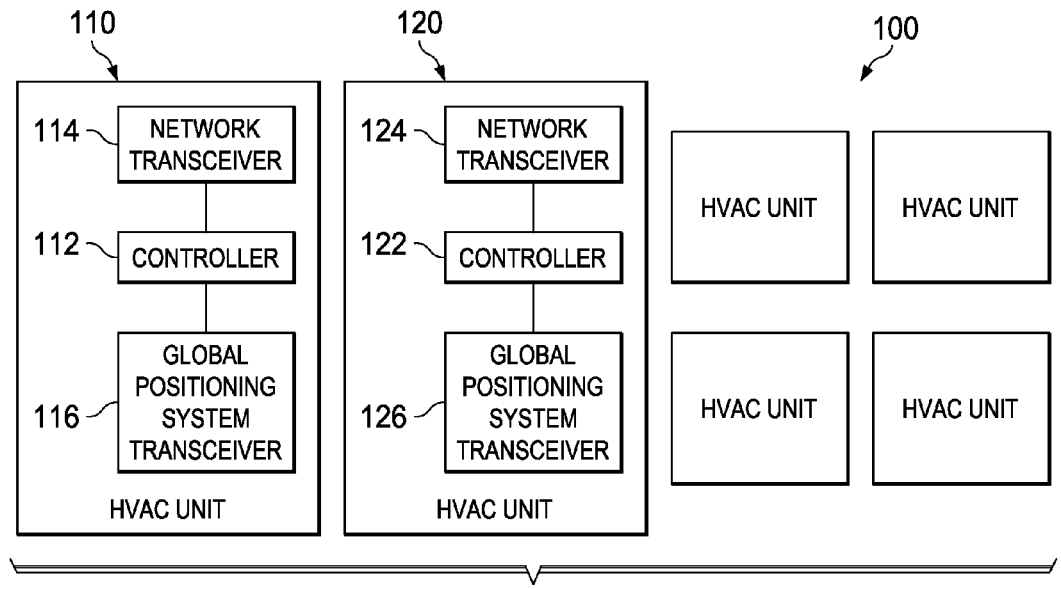
FIG. 1 is a block diagram of an embodiment of a staggered start-up HVAC system constructed according to the principles of the disclosure.
Figure 2:
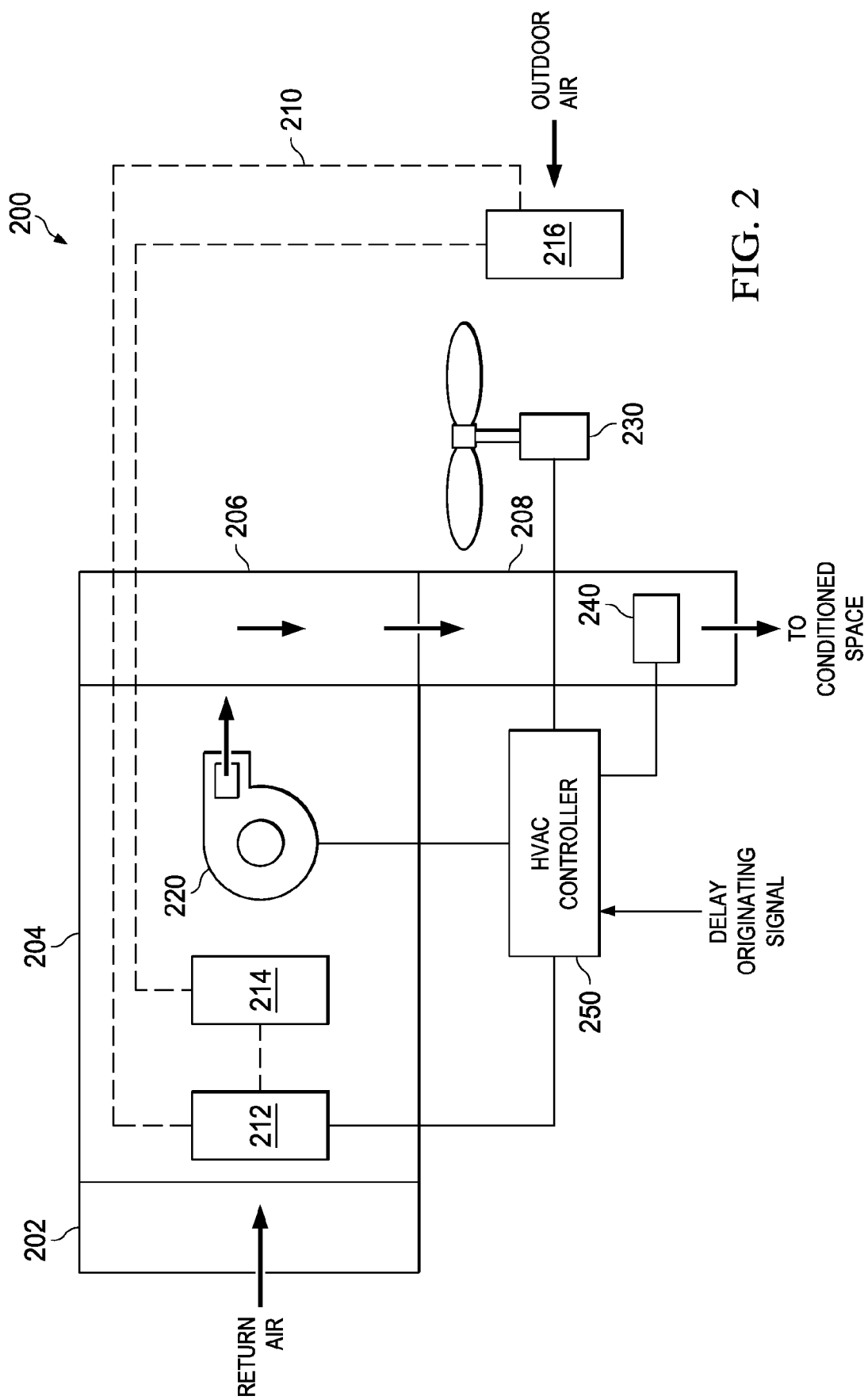
FIG. 2 is a block diagram of an embodiment of a HVAC system constructed according to the principles of the disclosure.

FIG. 1 is a block diagram of a staggered start-up HVAC system 100 constructed according to the principles of the present disclosure. The HVAC system 100 includes multiple HVAC units at a single application. The type of HVAC units in the HVAC system 100 may vary. Additionally, each of the HVAC units may be the same type of HVAC unit or there may be different types of HVAC units within the HVAC system 100. The multiple HVAC units of the HVAC system 100 are represented by two HVAC units denoted as a first HVAC unit 110 and a second HVAC unit 120. FIG. 2 illustrates a HVAC unit in more detail that may represent one or more of the multiple HVAC units of the HVAC system 100, including the first and second HVAC units 110, 120.

Figure 3:
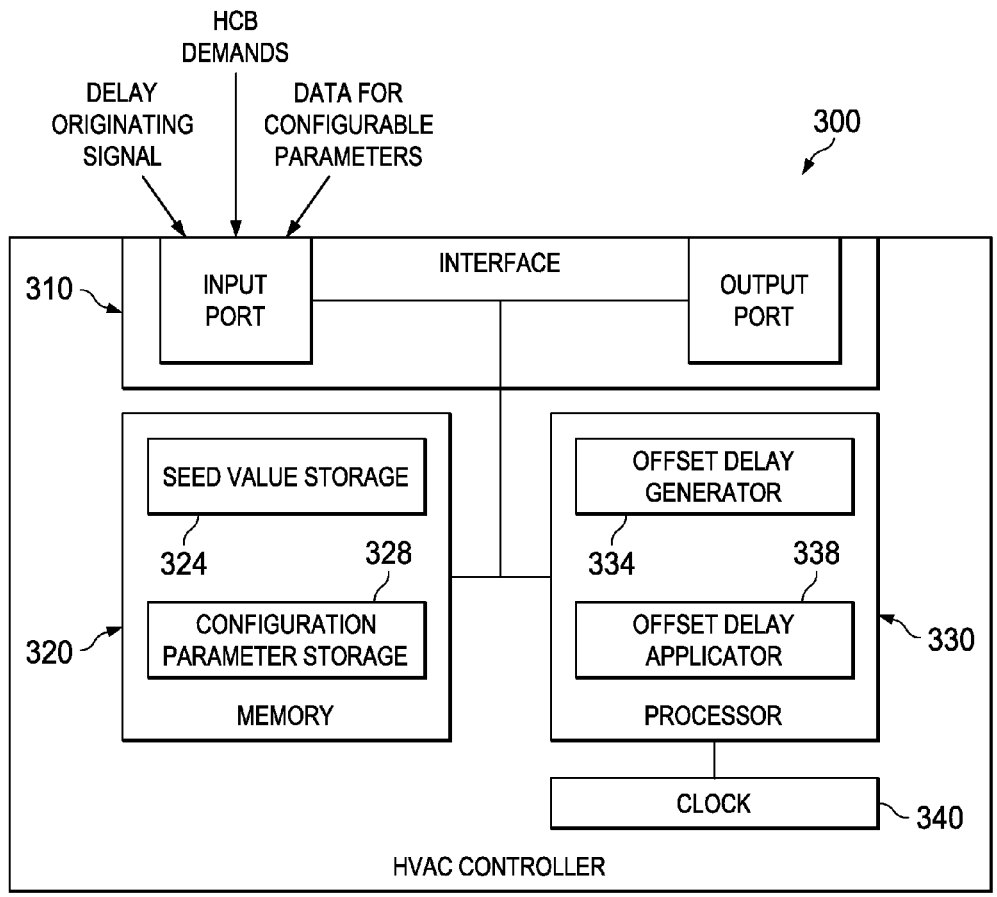
FIG. 3 is a diagram of an embodiment of a HVAC controller constructed according to the principles of the disclosure.

The first HVAC unit 110 and the second HVAC unit 120 include a first HVAC controller 112 and a second HVAC controller 122 that are constructed according to the principles of the present disclosure. FIG. 3 provides more detail of an HVAC controller constructed according to the disclosure. Additionally, each of the first and second HVAC units 110, 120, includes a network transceiver 114, 124, and a GPS transceiver 116, 126, that are coupled to the respective HVAC controllers 112, 122. The network transceivers 114, 124, and the GPS transceivers 116, 126, may be conventional devices well known in the art.

The first and second HVAC controllers 112, 122, include an interface configured to receive a delay originating signal and a processor configured to automatically generate an offset delay value for the respective HVAC units 110, 120, upon receipt of the delay originating signal. The first and second HVAC controllers 112, 122, are also configured to delay starting identified components of the HVAC units 110, 120, based on the offset delay value. An offset delay value for the first HVAC unit 110 differs from an offset delay value for the second HVAC unit 120. As such, start-up of the HVAC unit 110 will occur at a different time than start-up of the HVAC unit 120. Since the HVAC units 110, 120, will have a staggered start-up, power-spikes for the HVAC system 100 may be reduced or eliminated.

The delay originating signal may be an initialization signal associated with the first or second HVAC units 110, 120. The initialization signal may be a communications network initialization signal or a GPS initialization signal that are used to establish either the communications network via the network transceivers 114, 124, or the GPS via the GPS transceivers 116, 126. The delay originating signal may also be an event signal such as a demand (e.g., a heating or cooling demand) or a power-up signal.

The HVAC controllers 112, 122, are configured to generate the respective offset delay values for the HVAC units 110, 120. In one embodiment, the HVAC controllers 112, 122, may generate the offset delay values based on a GPS coordinate for the HVAC units 110, 120. Additionally, the HVAC controllers 112, 122, may generate the offset delay values based on a serial number of each respective HVAC unit 110, 120. In other embodiments, the HVAC controllers 112, 122, may generate the offset delay values based on a clock, such as a free-running clock counter of HVAC controllers 112, 122. The HVAC controllers 112, 122, may also generate a hierarchy of offset delay values that are broadcast to other HVAC units are used to generate unique offset delay values therefore. The HVAC controllers 112, 122, may also be configured to determine when to apply said offset delay value based on at least one configurable parameter.

The identified components for the first and second HVAC units 110, 120, may include a compressor, an indoor air blower, an outdoor fan and an electrical heating element. The processor may include an offset delay generator and an offset delay applicator that are configured to generate the offset delay value and determine when to apply the offset delay value.

FIG. 2 is a block diagram of an embodiment of an HVAC unit 200 constructed according to the principles of the disclosure. The HVAC unit 200 includes a return duct 202, a return plenum 204, a supply duct 206 and a supply plenum 208. Additionally, the HVAC unit 200 includes a refrigeration circuit 210, an indoor air blower 220, an outdoor fan 230, a heating element 240 and a HVAC controller 250. The refrigeration circuit 210 includes a compressor system 212, evaporator coils 214 and condenser coils 216. Each of the components of the refrigeration circuit 210 is fluidly coupled together. The compressor system 212, the evaporator coils 214 and the condenser coils 216 represent a single cooling stage. One skilled in the art will understand that this disclosure also applies to other HVAC embodiments having more than one cooling stage or more than one heating stage.

One skilled in the art will also understand that the HVAC unit 200 may include additional components and devices that are not presently illustrated or discussed but are typically included in an HVAC system, such as, a power supply, an expansion valve, a temperature sensor, a humidity sensor, etc. A thermostat (not shown) is also typically employed with the HVAC unit 200 and used as a user interface. Additionally, as illustrated in FIG. 1, the HVAC unit 200 may include a network transceiver or a GPS transceiver. The various illustrated components of the HVAC unit 200 may be contained within a single enclosure (e.g., a cabinet). In one embodiment, the HVAC unit 200 is a rooftop unit.

The refrigeration circuit 210, the indoor air blower 220, the outdoor fan system 230 and the heating element 240 may be conventional devices that are typically employed in HVAC systems. At least some of the operation of the HVAC unit 200 can be controlled by the HVAC controller 250 based on inputs from various sensors of the HVAC unit 200 including a temperature sensor or a humidity sensor. For example, the HVAC controller 250 can cause the indoor air blower 220 to move air across the evaporator coils 214 and into an enclosed space.

The HVAC controller 250 may include a processor, such as a microprocessor, configured to direct the operation of the HVAC unit 200. Additionally, the HVAC controller 250 may include an interface and a memory section coupled thereto. The interface may be configured to receive a delay originating signal. The processor may be configured to automatically generate an offset delay value for the HVAC unit in response to the delay originating signal and delay starting identified components of the HVAC unit based on the offset delay value. For example, the HVAC controller 250 may receive notification of an event, such as an occupied state or a thermostat call that calls for initiating the HVAC unit 200. The HVAC controller 250 may respond by employing the offset delay value when starting the HVAC unit. As such, the HVAC controller 250 may delay starting the compressor system 212, the indoor air blower 220, the outdoor fan system 230 and the heating element 240 by the offset delay value. Accordingly, start-up for the HVAC unit 200 may occur at a different time than other HVAC units at the same application which also receive notification of the event that calls for HVAC unit initiation.

As illustrated in FIG. 2, the HVAC controller 250 is coupled to the various components of the HVAC unit 200. In some embodiments, the connections therebetween are through a wired-connection. A conventional cable and contacts may be used to couple the HVAC controller 250 to the various components of the HVAC unit 200. In other embodiments, a wireless connection may also be employed to provide at least some of the connections.

FIG. 3 is a diagram of an embodiment of a HVAC controller 300 constructed according to the principles of the disclosure. The HVAC controller 300 is configured to control operations of an HVAC system. The HVAC controller 300 includes an interface 310, a memory 320 and a processor 330. A clock 340, such as a free running clock counter, associated with the processor 330 is also included. The HVAC controller 300 may also include additional components typically included within a controller for a HVAC system, such as a power supply or power port.

The interface 310 is configured to receive a delay originating signal. The interface 310 may be a conventional device for transmitting and receiving data and may include multiple ports for transmitting and receiving data. The ports may be conventional receptacles for communicating data via various means such as, a portable memory device, a PC or portable computer a communications network or another type of port designed to receive a delay originating signal or data for a configurable parameter. The interface 310 may be coupled to a network transceiver or a GPS transceiver to provide communication between the transceivers and the HVAC controller 300. The interface 310 is also coupled to the memory 320.

The memory 320 may be a conventional memory that is constructed to store data and computer programs. The memory 320 is configured to store operating instructions to direct the operation of the processor 330 when initiated thereby. The series of operating instructions may represent algorithms that are used by the processor 330 to direct operation of the HVAC unit including initiating start-up and employing an offset delay value when applicable. The HVAC system may be a rooftop unit. The algorithm may be represented by the flow diagram illustrated in FIG. 4.

The processor 330 is configured to automatically generate the offset delay value for a HVAC unit upon receipt of a delay originating signal. Additionally, the processor 330 is configured to delay starting identified components of the HVAC unit based on the offset delay value. The processor 330 includes an offset delay generator 334 and an offset delay applicator 338. The offset delay generator 334 is configured to generate the offset delay value and the offset delay applicator 338 is configured to determine when to apply the offset delay value.

The offset delay generator 334 is configured to generate the offset delay value without needing to set a unique value at each HVAC controller for the respective HVAC units. In one embodiment, the offset delay generator 334 may establish the offset delay value as zero and broadcast the zero offset delay value to another HVAC controller of another HVAC unit at a same installation of HVAC unit. In this embodiment, the HVAC unit associated with the HVAC controller 300 becomes the master unit during initialization and each subsequent HVAC unit and associated controller that becomes master sends a broadcast message containing its offset delay value which equals the previously broadcasted offset delay value and some predetermined amount of time.

In another embodiment, the offset delay generator 334 may be configured to employ the unique GPS coordinates of the HVAC unit to generate the offset delay value. During initialization of the GPS associated with the HVAC unit, the offset delay generator 334 may use the unique GPS coordinates of the HVAC unit to determine the offset delay. The GPS coordinates may be obtained from a GPS transceiver of the HVAC unit and stored in the memory 320. The GPS coordinates may be used as a seed value to generate the offset delay value. The memory 320 may include a designated location, seed value storage 324, for storing a seed value.

Other seed values may also be used by the offset delay generator 334 to generate the offset delay value. Accordingly, the seed value may be a number of bits taken from storage, such as the seed value storage 324. The number of bits employed may vary from one to the maximum number of bits available in the storage location of the seed value storage 324. The number of bits (N) used sets an upper limit ($2^N$) on the number of unique time delays that can be generated. The number of unique time delays possible should be larger than the largest number of HVAC controllers expected in any given installation for which start-up staggering is desired. In one embodiment, the offset delay generator 334 may use the serial number of the HVAC controller 300 as a seed value. In another embodiment, the offset delay generator 334 may use a free-running clock counter of the HVAC controller 300 as the seed value.

In one embodiment, the offset delay generator 334 generates the offset delay value by taking the N least significant bits from the seed value. The offset delay generator 334 then reverses the order of the N bits, to make the least significant bits in the seed value now the most significant bits. One is then added to the result so that even if the seed value were 0, there will still be some small start-up delay generated. The offset delay generator 334 then divides this value by (1+2/1N) to get a value between 1/(1+2/1N) and 1. Subsequently, the offset delay generator 334 multiplies this value by a delay configuration parameter that sets the offset delay value that is used for the start-up delay. The delay configuration parameter may be stored in a configuration parameter storage 328 section of the memory 320. The delay configuration parameter may be entered during manufacturing, installation or via a communications network which may be after installation. In some embodiments, another configurable parameter may also be set during manufacturing and used as a nominal start-up delay. The nominal start-up delay can then be reset by a user to a value between zero and some maximum value allowed.

If employing the serial number as the seed value, the offset delay value will be the same for the HVAC controller 300 when computed since the serial number for the HVAC controller 300 does not change. Accordingly, employing unique serial numbers guarantees that each HVAC controller will generate a unique time delay.

If employing the clock counter, the seed value is different due to the fast changing nature of a free-running clock-counter of the processor 330 and due to the fact that each HVAC controller 300 will generate an event notification for HCB at a slightly different value of its clock-counter than the other HVAC controllers at an application. Thus, the generated offset delay value will vary between its minimum and maximum allowed values on every occurrence of an event requiring a start-up delay. However, there is no guarantee that there will not be a coincidence where two or more HVAC controllers have computed the same time delay, and will therefore start their HCB elements simultaneously.

The offset delay applicator 338 may be configured to determine when to apply the offset delay value based on at least one configurable parameter. Another configurable parameter, offset enabled, allows user setting of those events for which staggered start-up is enabled. The factory default setting for the offset enabled parameter may include power-on reset (POR) and coming-out-of-night-setback events. POR events may be detected by the processor 330 when power is applied. A coming-out-of-night-setback event may be indicated by an occupied input or a building automation network signal that represents transitioning from un-occupied to occupied state. Other events that can be set to enable a staggered start-up delay include processor 330 resets due to loss of network communication, internal causes or a network command. A user can also set this parameter so that no events are selected, and unit start-up will not be staggered. This may be useful in cases where no stagger is desired, or staggered start-up is provided by some other control system element outside of the HVAC controller 300. Additionally, a user can set the offset enabled parameter where the offset delay value is not bypassed when a set point or occupancy command is received via a network connection. Instead, a unique command may be required in order to bypass the offset delay value. A user, manufacturer or technician, for example, may determine the unique command. The offset delay value may be enforced even when a thermostat input is used.

HCB demands may be received by the HVAC controller 300 by a variety of methods, including a thermostat, a building automation network or other executive controller communicating to the HVAC controller 300 via a communication channel. From whatever source, once the processor 300 determines that an HCB demand has been generated, the processor 300 checks for the most recent reset source. If the reset was caused by an event that is identified with the offset enabled parameter, the offset delay generator 334 computes the offset delay value and compares it to the time elapsed since the most recent reset. The offset delay applicator 338 waits until the computed time has elapsed before allowing the HVAC controller 300 to turn-on the identified components (e.g., any of the control elements for heating, cooling or blower operation. When the offset delay value expires, or is bypassed by a defined user input such as the push of a pushbutton or the receipt of a unique communication message, then the HVAC controller 300 will stop holding-off the identified components (e.g., the HCB elements), and allow the demand to be serviced.

Figure 4:
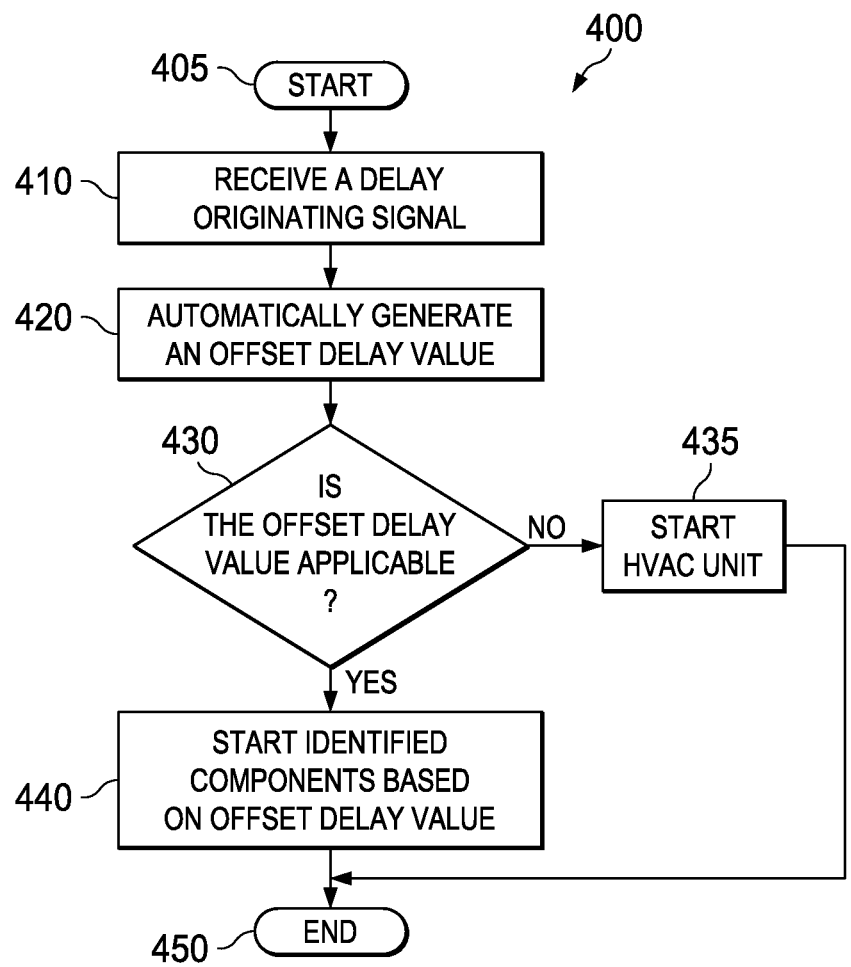
FIG. 4 is a flow diagram of an embodiment of a method of starting HVAC equipment carried out according to the principles of the disclosure.

FIG. 4 is a flow diagram of an embodiment of a method 400 for starting an HVAC unit carried out according to the principles of the disclosure. The HVAC unit may include a refrigeration circuit, an indoor air blower system an outdoor fan system and a heating element. An HVAC controller such as described with respect to FIG. 1, FIG. 2 or FIG. 3 may be used to perform the method 400. The method 400 may represent an algorithm that is stored on a computer readable medium, such as a memory of an HVAC controller (e.g., the memory 320 of FIG. 3) as a series of operating instructions that can direct the operation of a processor (e.g., the processor 330 of FIG. 3). The method 400 begins in a step 405.

In a step 410, a delay originating signal is received at a controller for the HVAC unit. The delay originating signal may be an initialization signal associated with the HVAC unit. Additionally, the delay originating signal may be a power-on signal or a HCB demand.

An offset delay value is generated for the HVAC unit based upon receipt of the delay originating signal in a step 420. The offset delay value may be in seconds and represent an amount of time to delay starting a high current component of the HVAC unit. The offset delay value is generated automatically.

In a decisional step 430, a determination is made if the offset delay value is applicable for the delay originating signal. An offset enabled parameter may be used to determine if the offset delay value is applicable. The offset enabled parameter may be entered by a user. If applicable, identified components of the HVAC unit are started based on the offset delay value in a step 440. The method 400 then ends in a step 450.

Returning now to the decisional step 430, if the offset delay value is not applicable to the delay originating signal, the HVAC unit is started without employing the delay offset value in a step 435. The method then continues to step 450 and ends.

The above-described methods may be embodied in or performed by various conventional digital data processors, microprocessors or computing devices, wherein these devices are programmed or store executable programs of sequences of software instructions to perform one or more of the steps of the methods, e.g., steps of the method of FIG. 4. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computing devices to perform one, multiple or all of the steps of one or more of the above-described methods, e.g., one or more of the steps of the method of FIG. 4. Additionally, an apparatus, such as dedicated HVAC controller, may be designed to include the necessary circuitry to perform each step of the methods of FIG. 4.

Those skilled in the art to which this application relates will appreciate that other and further additions, deletions, substitutions and modifications may be made to the described embodiments.

What is claimed is:

1. A controller for a heating, ventilating and air conditioning (HVAC) unit, comprising:
   an interface configured to receive a delay originating signal; and
   a processor configured to automatically generate an offset delay value for said HVAC unit upon receipt of said delay originating signal, determine whether to apply said offset delay value based on at least one configurable parameter and delay starting identified components of said HVAC unit based on said offset delay value.

2. The HVAC controller as recited in claim 1 wherein said offset delay value is a unique value for said HVAC unit.

3. The HVAC controller as recited in claim 1 wherein said delay originating signal is an initialization signal for said HVAC unit.

4. The HVAC controller as recited in claim 3 wherein said processor establishes said offset delay value as zero and broadcast said offset delay value to another HVAC controller of another HVAC unit at a same installation of said HVAC unit.

5. The HVAC controller as recited in claim 3 wherein said processor generates said offset delay value based on a GPS coordinate for said HVAC unit.

6. The HVAC controller as recited in claim 1 wherein said processor generates said offset delay value based on a serial number associated with said HVAC unit.

7. The HVAC controller as recited in claim 1 wherein said processor generates said offset delay value based on a clock counter of said HVAC controller.

8. The HVAC controller as recited in claim 1 wherein said processor includes an offset delay generator and an offset delay applicator, said generator configured to generate said offset delay value and said applicator configured to determine when to apply said offset delay value.

9. The HVAC controller as recited in claim 8 wherein said offset delay applicator is configured to determine when to apply said offset delay value based on at least one configurable parameter.

10. A method for starting a heating, ventilating and air conditioning (HVAC) unit, said method comprising:
- receiving a delay originating signal at a controller for said HVAC unit;
- automatically generating said offset delay value for said HVAC unit based upon receipt of said delay originating signal; and
- determining if said offset delay value is applicable for said delay originating signal;
- starting identified components of said HVAC unit based on said offset delay value and said determining, wherein said offset delay value differs from an offset delay value for another HVAC unit at the same application.

11. The method as recited in claim 10 wherein said offset delay value is a unique value for said HVAC unit.

12. The method as recited in claim 10 wherein said delay originating signal is an initialization signal for said HVAC unit.

13. The method as recited in claim 12 wherein said automatically generating said offset delay value includes establishing said offset delay value as zero when said originating signal is a initialization signal and further comprising broadcasting said offset delay value to another HVAC controller of another HVAC unit at a same installation of said HVAC unit.

14. The method as recited in claim 12 wherein said automatically generating said offset delay value is based on a GPS coordinate for said HVAC unit when said originating signal is a initialization signal.

15. The method as recited in claim 10 wherein said automatically generating said offset delay value is based on a serial number associated with said HVAC unit.

16. The method as recited in claim 10 wherein said automatically generating said offset delay value is based on a clock counter of said HVAC controller.

17. A heating, ventilating and air conditioning (HVAC) system, comprising:
- a first and second HVAC unit, each HVAC unit including:
  - a refrigeration circuit having at least one compressor, a corresponding evaporator coil and a corresponding condenser coil;
  - an indoor air blower configured to move air across said evaporator coil;
  - an outdoor fan configured to move air across said condenser coil; and
  - a controller coupled to said refrigeration circuit, said indoor air blower and said outdoor fan, said controller having:
    - an interface configured to receive a delay originating signal; and
    - a processor configured to
      - automatically generate an offset delay value for said HVAC unit upon receipt of said delay originating signal,
      - determine whether to apply said offset delay value based on at least one configurable parameter, and
      - delay starting identified components of said HVAC unit based on said offset delay value,
    - wherein an offset delay value for said first HVAC unit differs from an offset delay value for said second HVAC unit and said identified components include said at least one compressor, said indoor air blower and said outdoor fan of said first and second HVAC unit.

18. The HVAC system as recited in claim 17 wherein said processor includes an offset delay generator and an offset delay applicator, said generator configured to generate said offset delay value and said applicator configured to determine when to apply said offset delay value.

* * * * *